US006944252B2

United States Patent
Okamoto

(12) United States Patent
(10) Patent No.: US 6,944,252 B2
(45) Date of Patent: Sep. 13, 2005

(54) PHASE COMPARATOR CIRCUIT

(75) Inventor: Masaaki Okamoto, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 712 days.

(21) Appl. No.: 09/956,880

(22) Filed: Sep. 21, 2001

(65) Prior Publication Data
US 2002/0039397 A1 Apr. 4, 2002

(30) Foreign Application Priority Data
Sep. 29, 2000 (JP) .................................. 2000-299311

(51) Int. Cl.[7] .............................................. H03D 3/24
(52) U.S. Cl. ................................... 375/376; 307/269
(58) Field of Search ................................ 375/376, 373, 375/130; 327/156

(56) References Cited

U.S. PATENT DOCUMENTS

| 4,178,560 | A | * | 12/1979 | Maury | 331/1 A |
|---|---|---|---|---|---|
| 4,322,643 | A | * | 3/1982 | Preslar | 327/5 |
| 4,719,365 | A | * | 1/1988 | Misono | 327/154 |
| 4,774,479 | A | * | 9/1988 | Tateishi | 331/1 A |
| 4,922,141 | A | * | 5/1990 | Lofgren et al. | 327/158 |
| 5,184,027 | A | * | 2/1993 | Masuda et al. | 327/149 |
| 5,973,524 | A | * | 10/1999 | Martin | 327/156 |
| 6,259,290 | B1 | * | 7/2001 | Takada et al. | 327/158 |
| 6,323,692 | B1 | * | 11/2001 | Tsinker | 327/12 |
| 6,553,089 | B2 | * | 4/2003 | Huh et al. | 375/376 |
| 6,768,698 | B2 | * | 7/2004 | Kono | 365/233 |
| 2001/0020852 | A1 | * | 9/2001 | Saito | 326/93 |
| 2002/0051510 | A1 | * | 5/2002 | Noguchi | 375/376 |
| 2004/0062336 | A1 | * | 4/2004 | Kuwata et al. | 375/376 |

* cited by examiner

Primary Examiner—Stephen Chin
Assistant Examiner—Jia Lu
(74) Attorney, Agent, or Firm—Westerman, Hattori, Daniels & Adrian, LLP

(57) ABSTRACT

A data signal DATA is captured by flip-flops 10 and 11 alternately every half cycle time of a clock signal CLK, outputs of the flip-flops 10 and 11 are delayed by respective delay circuits 15 and 16 to generate delayed signals 10QD and 11QD, and an output of the flip-flop 10 and the delayed signal 11QD are provided to an XOR gate 18, while an output of the flip-flop 11 and the delayed signal 10QD are provided to an XOR gate 17. The delay times of the delay circuits may be variable. Furthermore, outputs of the XOR gates 17 and 18 may be captured by the respective flip-flops alternately every half-cycle time of a delayed clock signal obtained by delaying the clock signal CLK.

7 Claims, 14 Drawing Sheets

US 6,944,252 B2

PHASE COMPARATOR CIRCUIT

BACKGROUND OF THE INVENTION

1. Field of the Invention

The present invention relates generally to a phase comparator circuit, more particularly, to a phase comparator circuit for use in a clock regeneration PLL circuit to detect a lead or lag in clock signal phase relative to data signal edge and provide the detected signal through a loop filter to a voltage controlled oscillator (VCO).

2. Description of the Related Art

There are two types of phase comparator circuits; one is of an analog type outputting a signal proportional to a phase error detected and the other is of a digital type detecting a positive or negative polarity of a phase error. Since an offset component included in output of an analog phase comparator becomes problematic with increase in operating frequency, there has been a tendency that a digital phase comparator is adopted in a case where a phase error is desired to be the minimum.

FIG. 12 shows a prior art digital phase comparator circuit. FIGS. 13 and 14 are time charts showing operation of this circuit, wherein FIG. 13 shows a case where falling edges of a clock signal CLK lag corresponding edges of data signal DATA in phase while FIG. 14 shows a case where falling edges of the clock signal CLK lead corresponding edges of the data signal DATA in phase.

The data signal DATA is a non-return-to-zero (NRZ) signal and functions as a reference signal for the clock signal CLK which is regenerated from the data signal DATA. Clocks CLK and *CLK are in opposite phase with each other.

D flip-flops 10 and 11 detect logic levels of the data signal DATA on rises of the respective clock signals CLK and *CLK to hold the logic levels and give both outputs 10Q and 11Q thereof to an XOR (exclusive OR) gate 12. The output ED of the XOR gate 12 goes high when the outputs of the D flip-flops 10 and 11 are different in logic levels. The outputs 10Q and 11Q lag behind the data signal DATA and the time lag between the outputs 10Q and 11Q is equal to a half cycle time T/2 of the clock signal CLK, so each pulse of the signal ED has a width T/2 corresponding to an edge of the data signal DATA.

D flip-flops 13 and 14 detect logic levels of the signal ED on rising edges of the respective clock signals CLK and *CLK to output the result of the detection as an up signal UP and a down signal DWN, respectively.

When the phase comparator circuit of FIG. 12 is employed in a PLL circuit to raise the output frequency of a VCO by the up signal UP and lower it by the down signal DWN, the PLL circuit operates such that a falling edge of the clock signal CLK and an edge of the data signal DATA coincide with each other in timing.

Since the pulse width of the edge detection signal ED is equal to that of the clock signal CLK, the timing margins of the flip-flops 13 and 14 detecting logic levels of the signal ED at rising edges of the clock signals CLK and *CLK are comparatively short. When the frequency of the clock signal CLK is higher than, for example, 10 GHz, the waveform of the clock signal CLK comes close to a triangular. Furthermore, the data signal DATA has jitter. For such reasons, timing errors arise in the D flip-flops 13 and 14, having lead to a problem of hindrance in high-speed operation.

SUMMARY OF THE INVENTION

Accordingly, it is an object of the present invention to provide a phase comparator circuit capable of operating at higher speed with increase in timing margin.

In one aspect of the present invention, there is provided a phase comparator circuit comprising: first and second flip-flop circuits for alternately capturing a data signal every half cycle time of a first clock signal; first and second delay circuits for delaying outputs of the first and second flip-flop circuits to generate first and second delayed signals, respectively; a first logic gate circuit receiving the output of the second flip-flop circuit and the first delayed signal; and a second logic gate circuit receiving the output of the first flip-flop circuit and the second delayed signal. Each of the first and second logic gate has an output activated when the logic levels of two inputs thereof are either the same or different, and is an exclusive OR gate or exclusive NOR gate for example. The first clock signal and the data may be a single-phase signal or complementary signals in opposite phase to each other. This applies to the second clock signal described below.

With this configuration, since a pulse width of the output of the first logic gate circuit is wider or narrower than that of the second logic gate circuit according to a case where the first clock signal lags or leads an edge of the data signal in phase, this circuit functions as a phase comparator.

Further, since there is no necessity to employ flip-flops for capturing data signals having a pulse width equal to a half cycle time of the clock signal, a problem of a small timing margin disappears, which makes the circuit suited for higher speed operation.

In another aspect of the present invention, there is provided the phase comparator circuit described above, wherein each of the first and second delay circuits has selectively variable delay times selected by a selection control signal.

With this configuration, since an output pulse width of the phase comparator becomes selectable, a loop gain in a PLL circuit can be externally adjustable according to characteristics of a loop filter and a VCO when the PLL circuit is configured with employing this phase comparator.

In still another aspect of the present invention, there is provided the phase comparator circuit described above and further comprising third and fourth flip-flop circuits for alternately capturing the outputs of the first and second logic gate circuits, respectively, every half cycle time of a second clock signal which is different from the first clock signal in phase.

With this configuration, pulses are outputted from one of the outputs of the third and fourth flip-flop circuits according to a case where the first clock signal lags or leads an edge of the data signal in phase. That is, a smaller width pulse from the other output of the first or second flip-flop is neglected.

Since a larger width pulse outputted from one of the first and second logic gates is larger than a half cycle time of the first clock signal, timing margins at the third and fourth flip-flops becomes wider, which makes the circuit more suited for high speed operation than the prior art phase comparator circuit of FIG. 12.

Other aspects, objects, and the advantages of the present invention will become apparent from the following detailed description taken in connection with the accompanying drawings.

DESCRIPTION OF THE PREFERRED EMBODIMENTS

Figure 1:
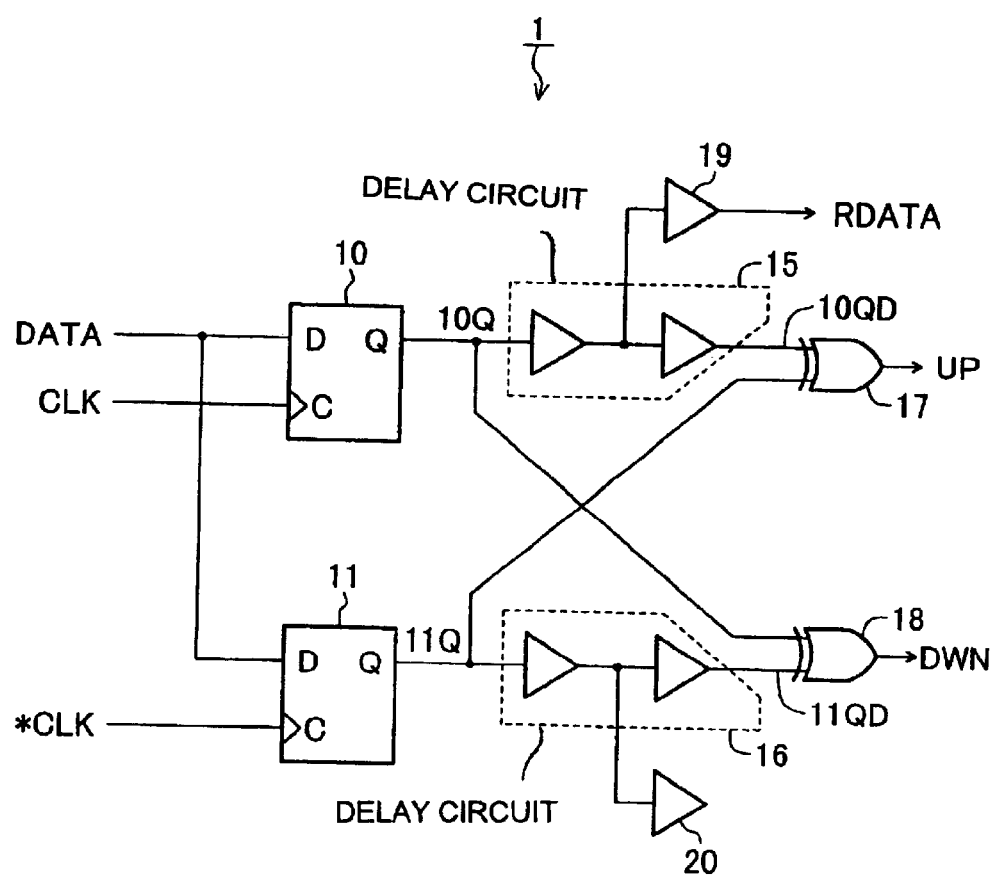
FIG. 1 is a diagram showing a phase comparator circuit of a first embodiment according to the present invention.

Referring now to the drawings, wherein like reference characters designate like or corresponding parts throughout several views, preferred embodiments of the present invention are described below.

First Embodiment

Figure 2:
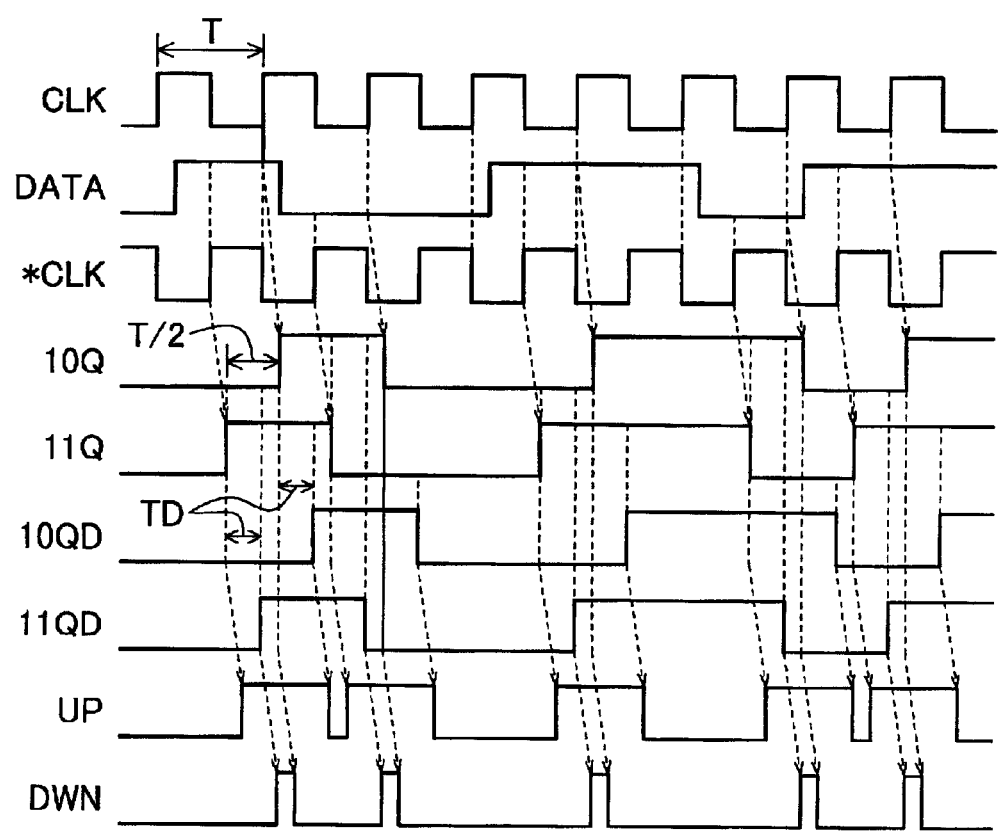
FIG. 2 is a time chart showing operation of the circuit of FIG. 1 in a case where falling edges of a clock signal CLK lag corresponding edges of data signal DATA in phase.
Figure 3:
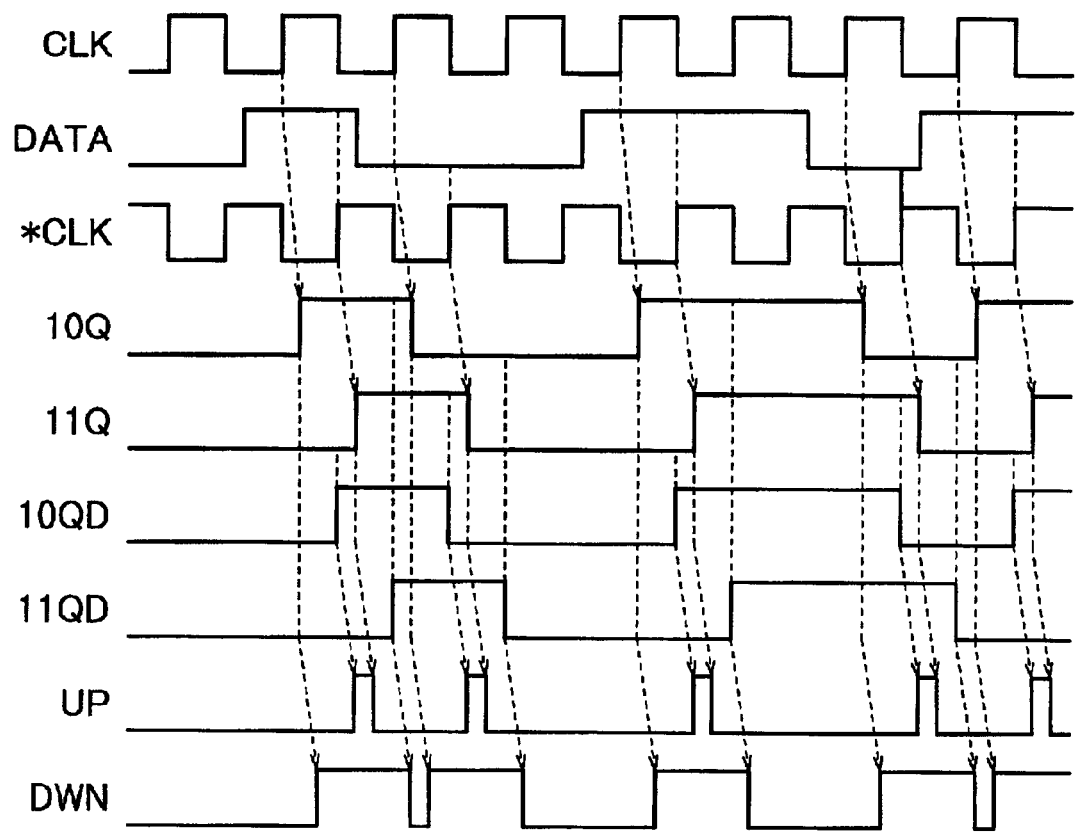
FIG. 3 is a time chart showing operation of the circuit of FIG. 1 in a case where falling edges of the clock signal CLK lead corresponding edges of the data signal DATA in phase.

FIG. 1 shows a phase comparator circuit of a first embodiment. FIGS. 2 and 3 are time charts showing operation of the circuit of FIG. 1, wherein FIG. 2 shows a case where falling edges of clock signal CLK lag corresponding edges of data signal DATA in phase, while FIG. 3 shows a case where falling edges of the clock signal CLK lead corresponding edges of the data signal DATA in phase.

Figure 12:
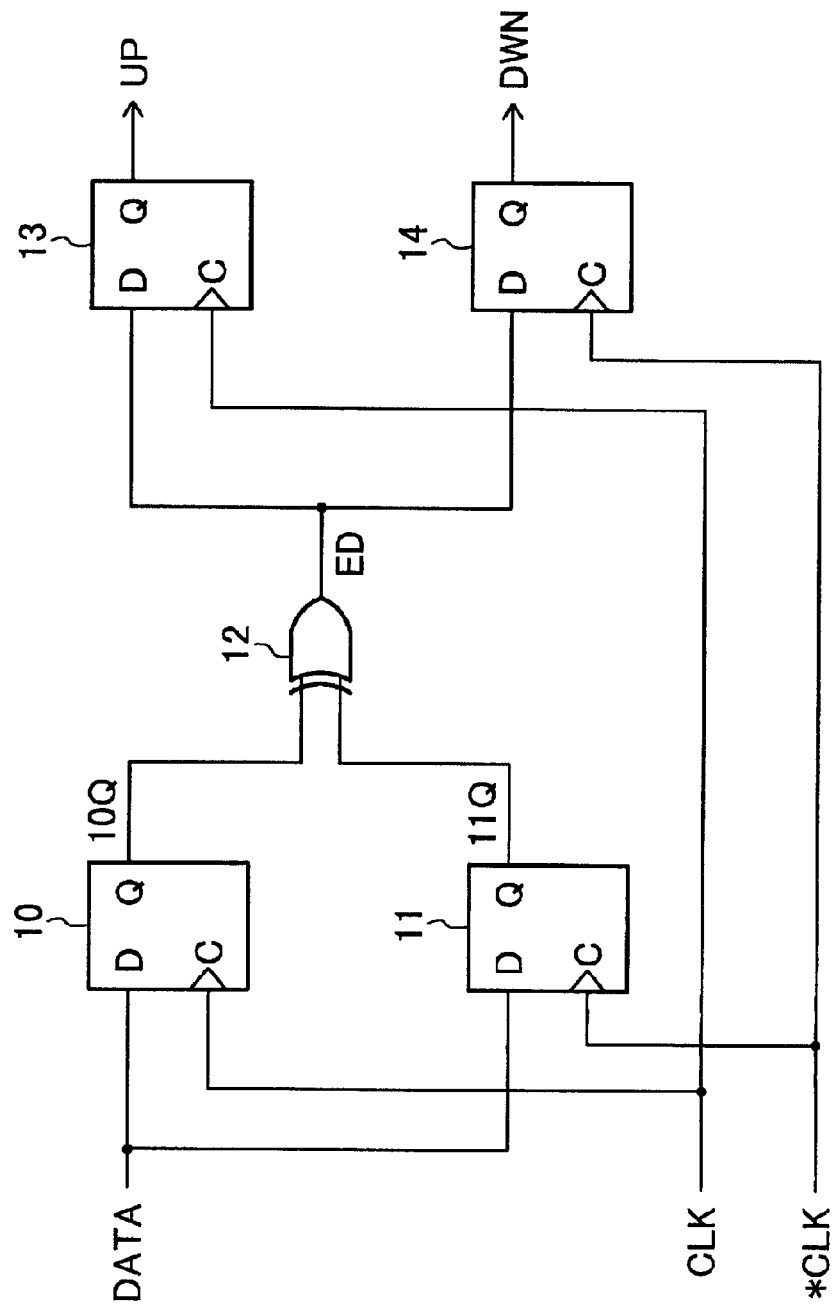
FIG. 12 is a prior art digital phase comparator circuit.
Figure 13:
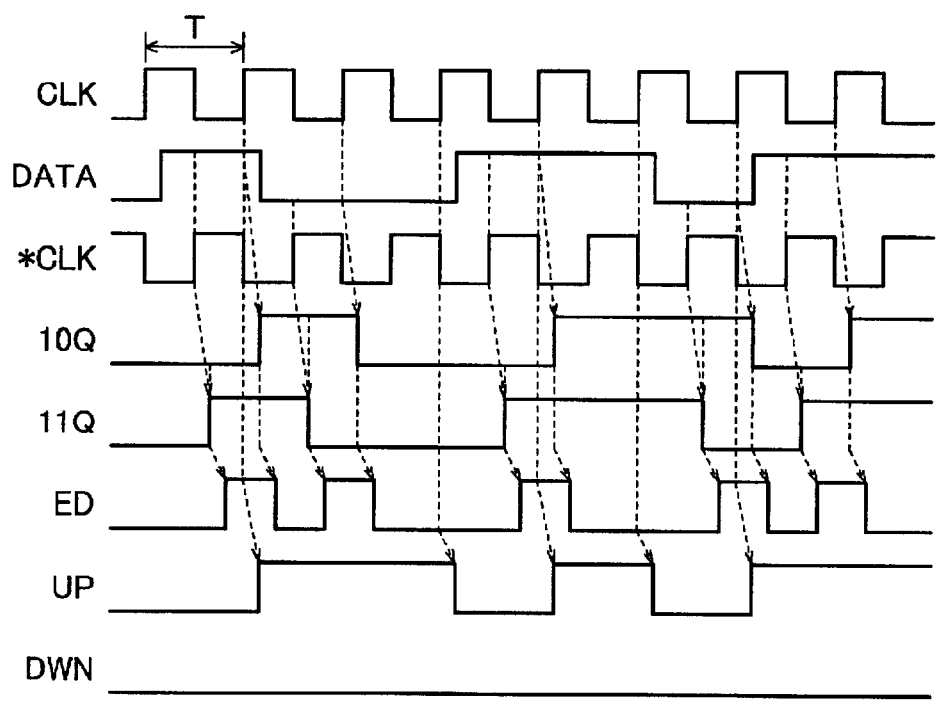
FIG. 13 is a time chart showing operation of the circuit of FIG. 12 in a case where falling edges of the clock signal CLK lag corresponding edges of the data signal DATA in phase.

In a manner similar to the case of FIG. 12, the data signal DATA is an NRZ signal and the clock signal CLK is regenerated from the data signal DATA. The clock signals CLK and *CLK are in opposite phase to each other. A cycle time of the clock signal CLK is hereinafter denoted by T.

Figure 14:
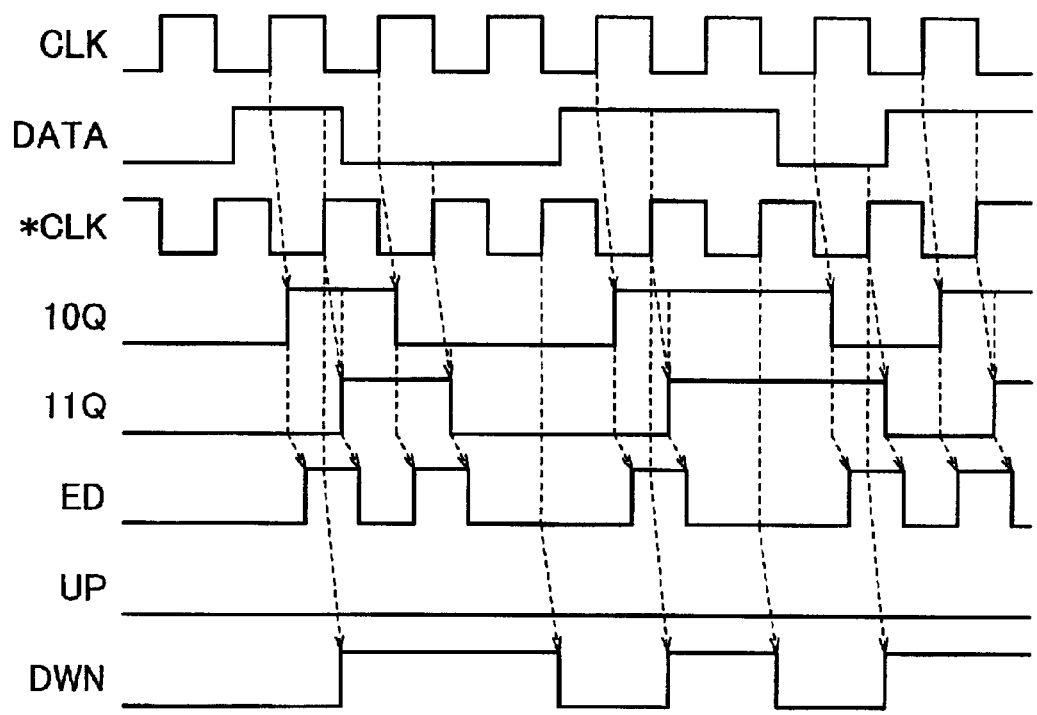
FIG. 14 is a time chart showing operation of the circuit of FIG. 12 in a case where falling edges of the clock signal CLK lead corresponding edges of the data signal DATA in phase.

The phase comparator circuit 1 is the same as that of FIG. 14 in that logic levels of the data signal DATA are detected by the D flip-flops 10 and 11 on rising edges of the clock signals CLK and *CLK, respectively. Each of the non-inverting outputs 10Q and 11Q of the D flip-flops 10 and 11 has a waveform obtained by delaying a phase of the data signal DATA as shown in FIGS. 2 and 3. In a case of the relationship of FIG. 2 in phase, the D flip-flop 11 detects an edge of the data signal DATA ahead of the D flip-flop 10 by T/2. Whereas in a case of the relationship of FIG. 3 in phase, the D flip-flop 10 detects an edge of the data signal DATA ahead of the D flip-flop 11 by T/2.

In FIG. 1, the non-inverting outputs 10Q and 11Q are delayed by passing through respective delay circuits 15 and 16 whose delay amounts TD are larger than 0, and the difference in delay amount between the delay circuits 15 and 16 has only to be almost an integral number times a cycle time of the clock signal CLK and is preferably 0 with 0<TD<T/2. FIGS. 2 and 3 show a case where TD=T/3. In FIG. 1, each of the delay circuits 15 and 16 is constructed of two cascaded non-inverting gates each can be constructed of even number of cascaded inverting gates.

The outputs 10QD and 11QD of the delay circuits 15 and 16 are provided to first inputs of XOR gates 17 and 18, respectively. The non-inverting outputs 11Q and 10Q are provided to the second inputs of the XOR gates 17 and 18, respectively. An up signal UP and a down signal DWN are outputted from the XOR gates 17 and 18, respectively.

As shown in FIG. 2, in a case where a falling edge of the clock signal CLK lags behind an edge of the data signal DATA, the signal 10Q rises after T/2 having passed from the rising of the signal 11Q. Therefore, the signal 10QD rises after (T/2+TD) having passed from the rising of the signal 11Q. Thus, a pulse width of the up signal UP is (T/2+TD) which is equal to 5T/6 in the case of FIG. 2. This pulse corresponds to a rising edge of the data signal DATA. In a similar manner, a pulse width of the up signal UP corresponding to a falling edge of the data signal DATA is equal to (T/2+TD)

Whereas the signal 10Q rises after (T/2−TD) having passed from the rising of the signal 11QD. Therefore, a pulse width of the down signal DWN is (T/2−TD) which is equal to T/6 in the case of FIG. 2. This pulse corresponds to a rising edge of the data signal DATA. Likewise, a pulse width of the down signal DWN corresponding to falling edges of the data signal DATA is also equal to (T/2−TD).

As shown in FIG. 3, in a case where a falling edge of the clock signal CLK leads an edge of the data signal DATA, the signal 11Q rises after T/2 having passed from the rising of the signal 10Q. Therefore, the signal 11QD rises after (T/2+TD) having passed from the rising of the signal 10Q. Thus, a pulse width of the down signal DWN is (T/2+TD) which is equal to 5T/6 in the case of FIG. 3. This pulse corresponds to a rising edge of the data signal DATA. In a similar manner, a pulse width of the down signal DWN corresponding to a falling edge of the data signal DATA is equal to (T/2+TD).

Whereas the signal 11Q rises after (T/2−TD) having passed from the rising of the signal 10QD. Therefore, a pulse width of the up signal UP is (T/2−TD) which is equal to T/6 in the case of FIG. 3. This pulse corresponds to a rising edge of the data signal DATA. Likewise, a pulse width of the up signal UP corresponding to falling edges of the data signal DATA is also equal to (T/2−TD).

As a result, in a case where a falling edge of the clock signal CLK lags behind an edge of the data signal DATA, a pulse width of the up signal UP corresponding to an edge of the data signal DATA is wider than that of the down signal DWN by 2TD, while in a case where a falling edge of the data signal DATA leads an edge of the data signal DATA, a pulse width of the down signal DWN corresponding to an edge of the data signal DATA is wider than that of the up signal UP by 2TD. Hence, the circuit of FIG. 1 operates as a phase comparator circuit without using the flip-flops 13 and 14 as in FIG. 12. In such a situation, there arises no problem associated with timing margins of the D flip-flops 13 and 14 of FIG. 12 and the phase comparator circuit of FIG. 1 is more suited for high speed operation than that of FIG. 12.

A buffer gate 19 is connected to the delay circuit 15 to take out retimed data signal RDATA from which jitter is removed. This retimed data signal RDATA is processed in synchronization with the clock signals CLK and *CLK in a circuit not shown. With connection of the buffer gate 19 to the delay circuit 15, a delay amount of the delay circuit 15 increases, and therefore a dummy buffer gate 20 is connected to the delay circuit 16 so as to adjust the delay amounts of the delay circuits 15 and 16 to be equal to each other.

Figure 4:
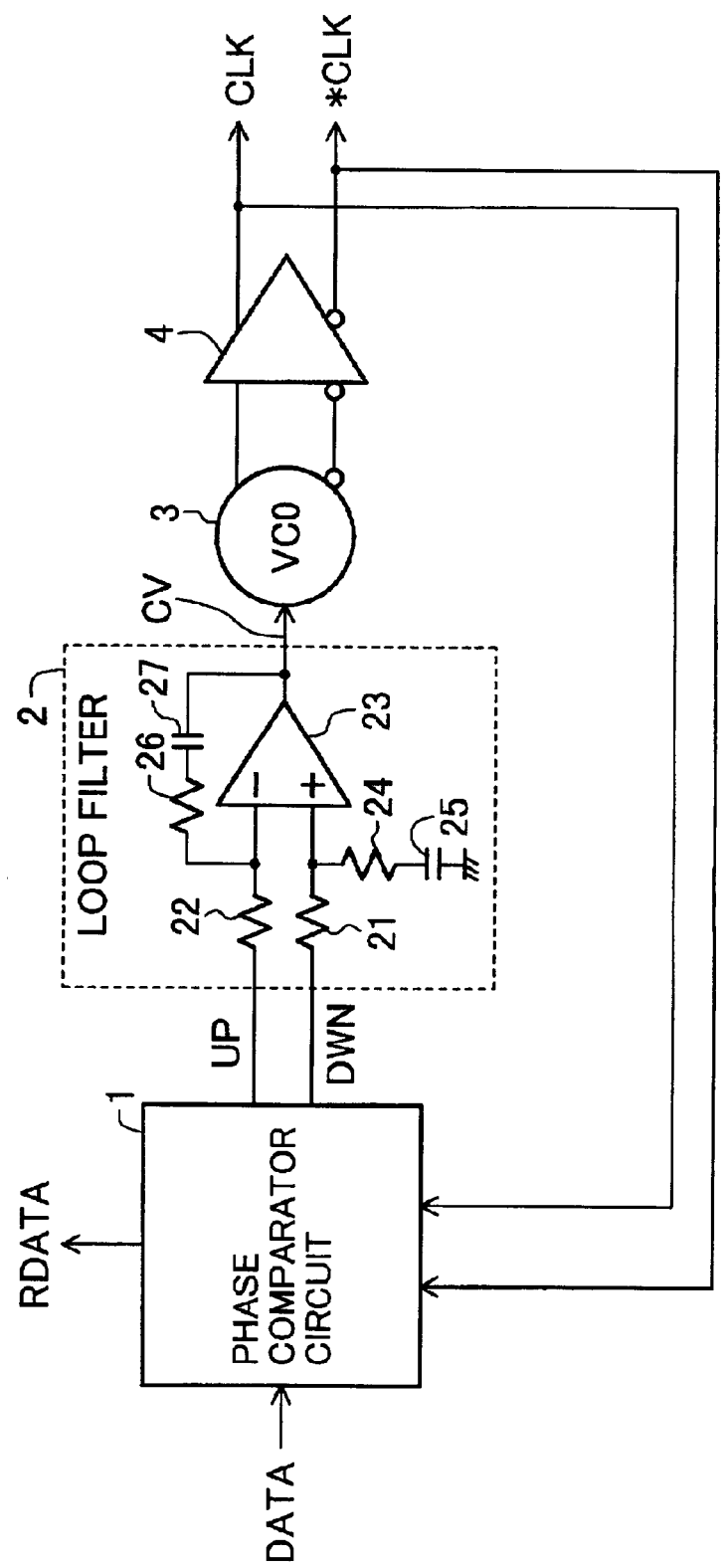
FIG. 4 is a diagram showing a PLL circuit for regenerating clock signals CLK and *CLK from the data signal DATA with employing the phase comparator circuit of FIG. 1.

FIG. 4 shows a PLL circuit for regenerating the clock signals CLK and *CLK from the data signal DATA with employing the phase comparator circuit 1 of FIG. 1

This circuit is configured such that the phase comparator circuit 1, a loop filter 2, a VCO (voltage controlled oscillator) 3 and a buffer gate circuit 4 are connected in a loop.

In the loop filter 2, the up signal UP and the down signal DWN are provided through resistors 21 and 22 to the inverting input and the non-inverting input of an operational amplifier 23, respectively. A resistor 24 and a capacitor 25 are connected in series between the non-inverting input of the operational amplifier circuit 23 and ground potential. A resistor 26 and a capacitor 27 are connected in series between the inverting input of the operational amplifier 23 and the output thereof. Potentials of the two inputs of the operational amplifier 23 are almost equal to each other, and therefore when the capacitor 25 is charged by pulses of the down signal DWN, the potential of the inputs of the operational amplifier 23 rise and the output voltage CV of the operational amplifier 23 also rises. A capacitor 27 is charged by pulses of the up signal UP, and thereby the control voltage CV falls.

VCO 3 is of, for example, a multi-vibrator type and in this case, as the control voltage rises, the frequency of the output clock signal falls. In the case of the multi-vibrator, complementary clock signals with no shift in phase therebetween can be generated with ease.

The complementary outputs of the VCO 3 are provided through the buffer gate circuit 4 to the phase comparator circuit 1 as the clock signals CLK and *CLK.

Figure 5:
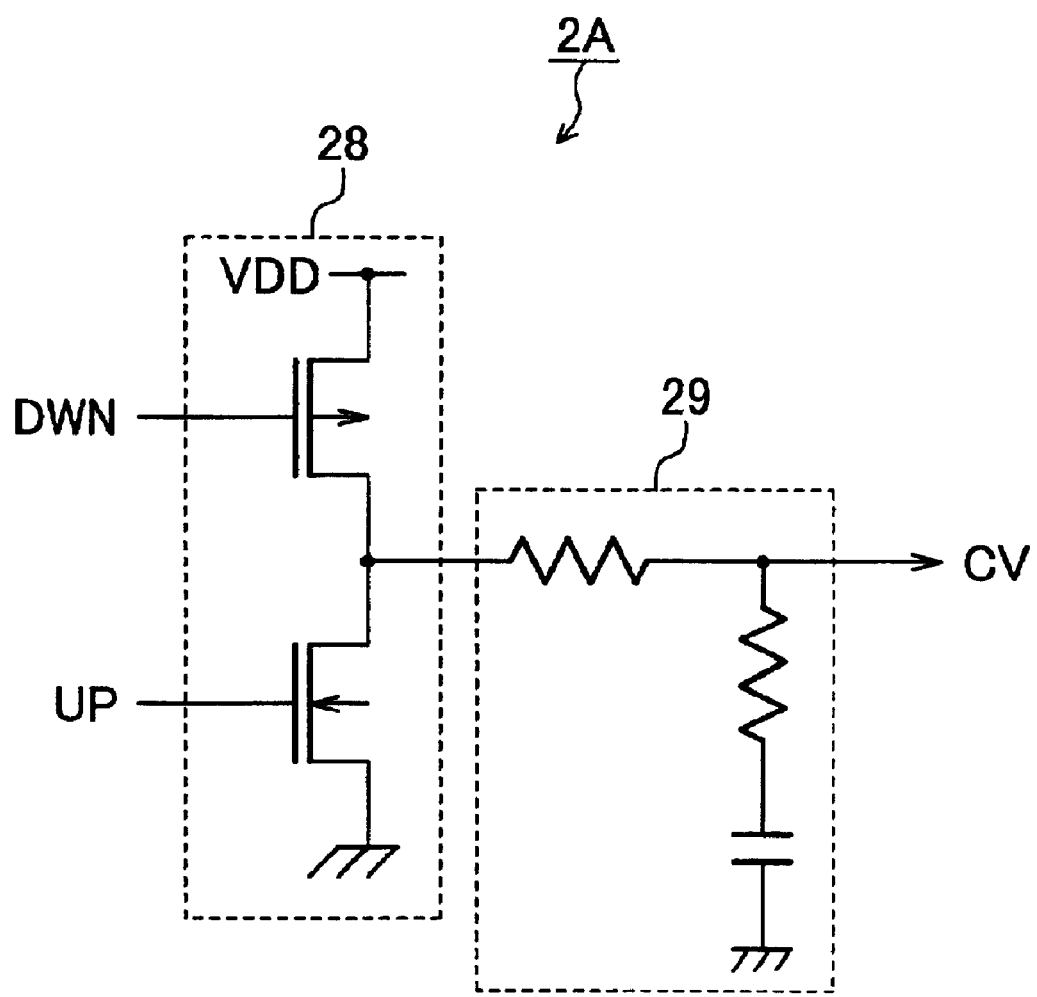
FIG. 5 is a diagram showing a modification of the loop filter in FIG. 4.

FIG. 5 shows a loop filter 2A that can substitute for the loop filter 2 of FIG. 4.

In this loop filter 2A, an integrator circuit 29 is connected to the output of a charge pump circuit 28. A capacitor in the integrator circuit 29 is charged by pulses of the down signal DWN to raise the control voltage CV while the capacitor is discharged by pulses of the up signal UP to lower the control voltage CV.

Note that in FIG. 4, the VCO 3 may be either a configuration including the buffer gate circuit 4, or a configuration in which a frequency divider is connected to the buffer gate circuit 4.

Second Embodiment

Figure 6:
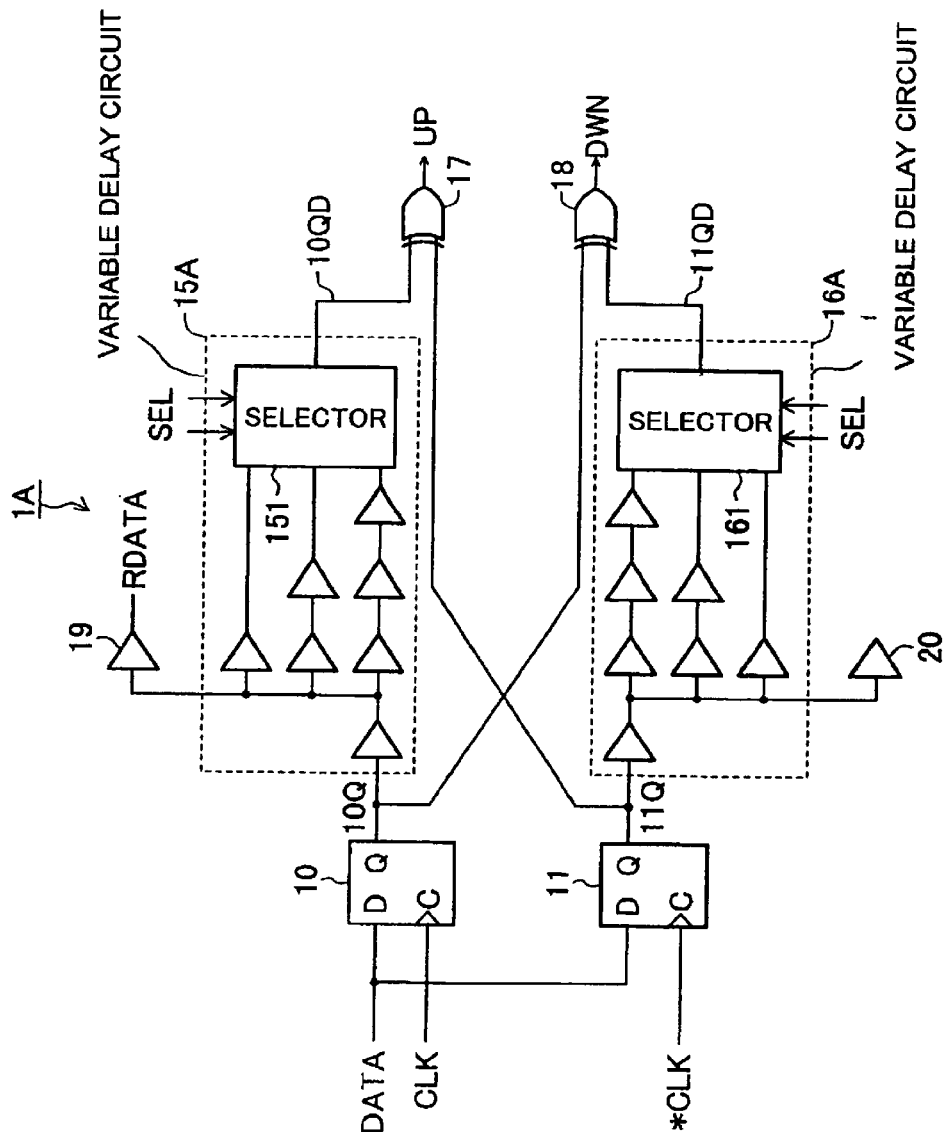
FIG. 6 is a diagram showing a phase comparator circuit of a second embodiment according to the present invention.

FIG. 6 shows a phase comparator circuit 1A of a second embodiment according to the present invention.

In this circuit 1A, variable delay circuits 15A and 16A are respectively employed instead of the delay circuits 15 and 16 of FIG. 1.

In the variable delay circuit 15A, a plurality of gate circuits with different number of stages are connected between the inputs of a selector 151 and the output of the D flip-flop 10, and the selector 151 selects one of the gate circuits according to a selection control signal SEL to output the delayed signal 10QD. The variable delay circuit 16A is of the same configuration as the variable delay circuit 15A, and the same selection control signal SEL as that to the selector 151 is provided to a selection control input of the selector 161 such that delay amounts of the variable delay circuits 15A and 16A are equal to each other.

By the variable delay circuits 15A and 16A, the delay amount TD, that is, a large pulse width and a small pulse width of the up signal UP and the down signal DWN, can be selected. By providing such a phase comparator circuit 1A to a user as an IC, it is possible that when the user constructs a PLL circuit as shown in FIG. 4, the delay amount TD is selected according to characteristics of the loop filter 2 and VCO 3, thereby enabling to construct a PLL circuit with higher performance.

Third Embodiment

Figure 7:
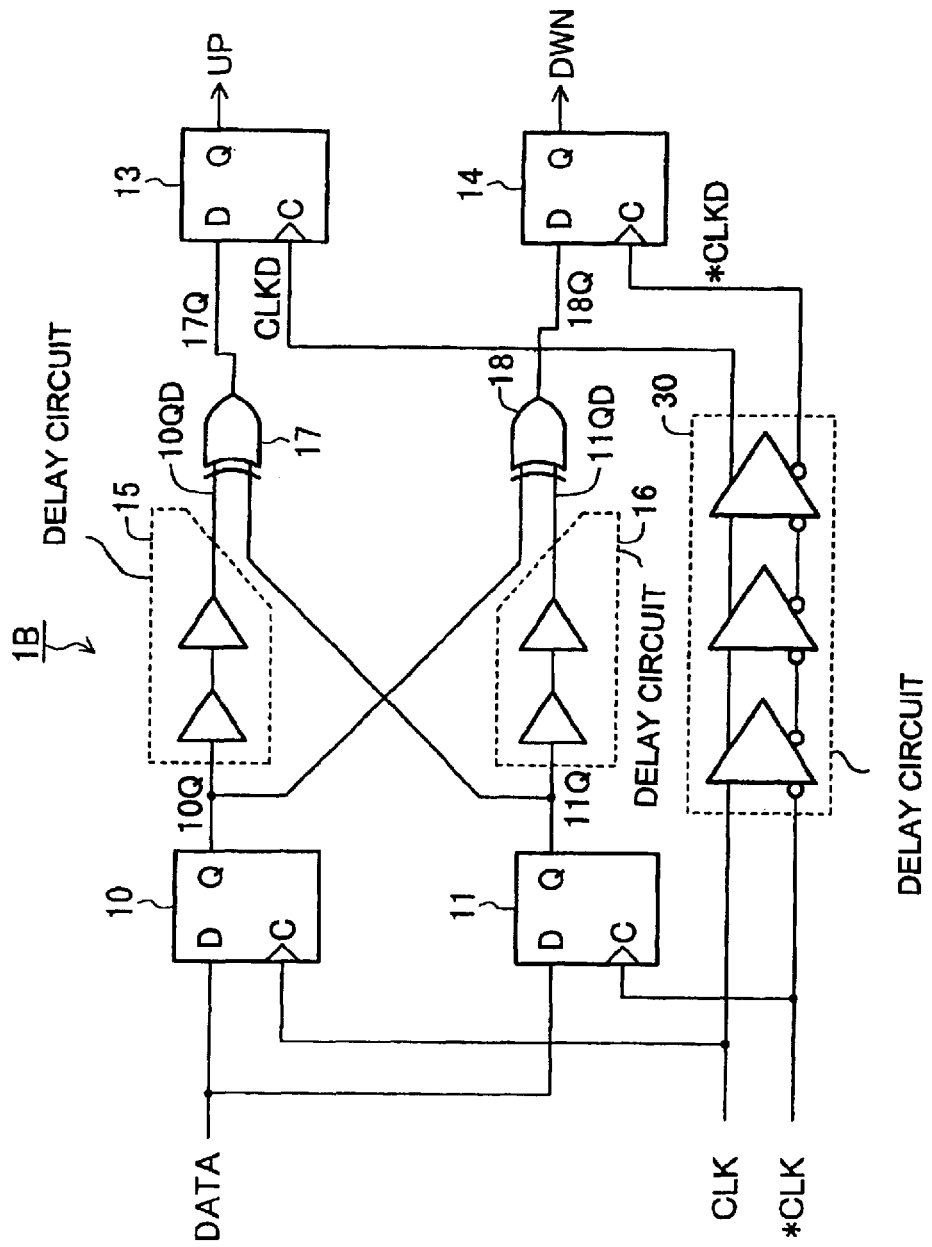
FIG. 7 is a diagram showing a phase comparator circuit of a third embodiment according to the present invention.

FIG. 7 shows a phase comparator circuit 1B of a third embodiment according to the present invention.

This circuit 1B has such a configuration that D flip-flops 13 and 14 and a delay circuit 30 are added to the circuit of FIG. 1, wherein the outputs 17Q and 18Q of the XOR gates 17 and 18 are provided to the data inputs D of the D flip-flops 13 and 14, respectively, and the clock signals CLK and *CLK are provided through the delay circuit 30 to the clock signal inputs C of the D flip-flops 13 and 14 as delayed clock signals CLKD and *CLKD. The delay circuit 30 is constructed of, for example, differential amplifier circuits each having complementary inputs and complementary outputs. Signals taken out from the non-inverting outputs Q of the D flip-flops 13 and 14 are used as the up signal UP and the down signal DWN, respectively.

Figure 8:
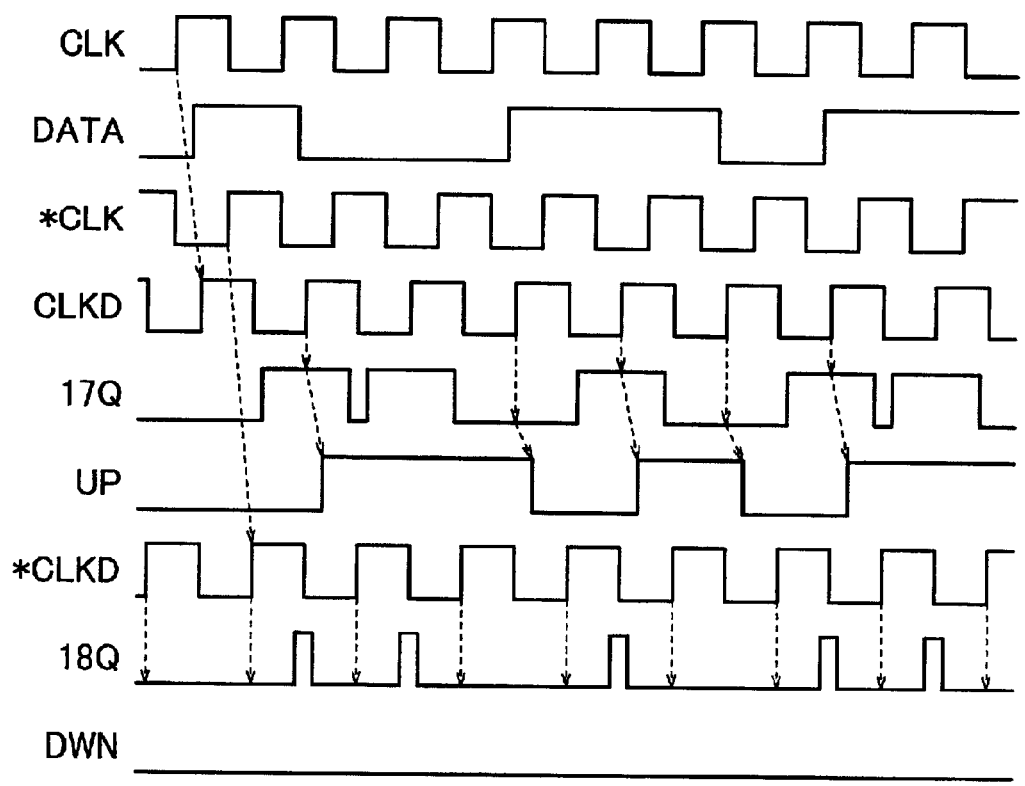
FIG. 8 is a time chart showing operation of the circuit of FIG. 7 in a case where falling edges of the clock signal CLK lag corresponding edges of the data signal DATA in phase.
Figure 9:
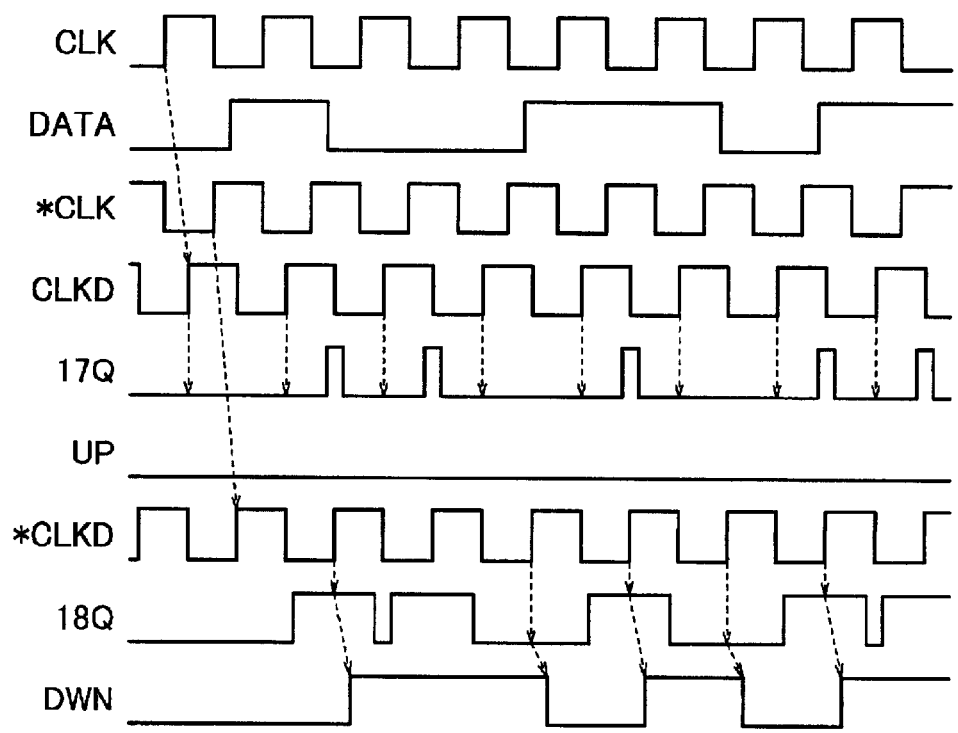
FIG. 9 is a time chart showing operation of the circuit of FIG. 7 in a case where falling edges of the clock signal CLK lead corresponding edges of the data signal DATA in phase.

FIGS. 8 and 9 are time charts showing operation of the circuit of FIG. 7, and FIG. 8 shows a case where falling edges of the clock signal CLK lag corresponding edges of the data signal DATA in phase, while FIG. 9 shows a case where falling edges of the clock signal CLK lead corresponding edges of the data signal DATA in phase. Waveforms of the clock signal CLK and the data signal DATA of FIGS. 8 and 9 are the same as those of FIGS. 2 and 3, respectively, and waveforms of the signals 10Q, 11Q, 17Q and 18Q omitted in FIGS. 8 and 9 are the same as corresponding ones of FIGS. 2 and 3.

The delay amount τ of the delay circuit 30 is determined in design such that in a case where the signal 17Q includes a pulse having a large width as shown in FIG. 8, the delayed clock signal CLKD rises in the middle of a pulse of the signal 17Q.

By doing so, in a case where the signal 18Q includes pulses having a large width as shown in FIG. 9, the delayed clock signal *CLKD rises in the middle of a pulse of the signal 18Q.

Thereby, in the case of FIG. 8, a pulse of the signal 17Q is detected on a rising edge of the delayed clock signal CLKD, and thereby the up signal UP goes high. Whereas, a pulse of the signal 18Q exists near a falling edge of the delayed clock signal *CLKD and stays low at a rising edge thereof, and therefore the down signal DWN stays low.

In the phase comparator circuit 1B of the third embodiment, although the D flip-flops 13 and 14 are employed as in FIG. 12, a pulse having a width larger than in the case of FIG. 12 is detected by the delayed clock signal, and therefore a timing margin becomes wider, which makes the phase comparator circuit 1B more suited for high speed operation than the circuit of FIG. 12.

Note that a preferable delay amount τ is τ=ΔT1+ΔT2+(TD+T/2)/2, where ΔT1 and ΔT2 denote the delay times of the D flip-flop 10 and the XOR gate 17, respectively, and τ+T/4 in FIGS. 8 and 9.

Further, the clock signals CLK and CLKD are only required to have a phase difference therebetween of a prescribed time, and therefore the clock signal provided to the D flip-flop 13 may be delayed to provide to the D flip-flop 10.

Fourth Embodiment

Figure 10:
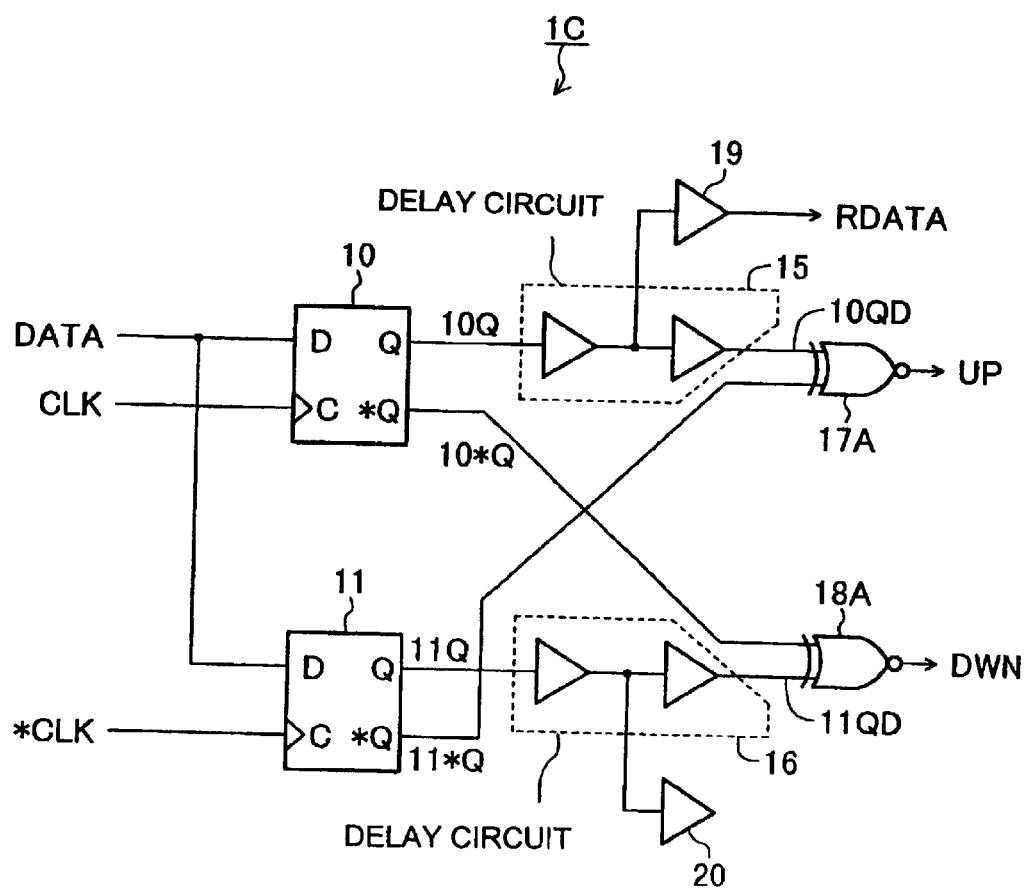
FIG. 10 is a diagram showing a phase comparator circuit of a fourth embodiment according to the present invention.

FIG. 10 shows a phase comparator circuit 1C of a fourth embodiment according to the present invention.

This circuit 1C is different from the circuit of FIG. 1 in that signals 10*Q and 11*Q of the inverting outputs of the D flip-flops 10 and 11 are provided to XNOR (exclusive NOR) gates 17A and 18A, respectively.

Note that the present invention includes circuits obtained by modifying the circuits of FIGS. 6 and 7 in a similar manner as the above described.

Fifth Embodiment

Figure 11:
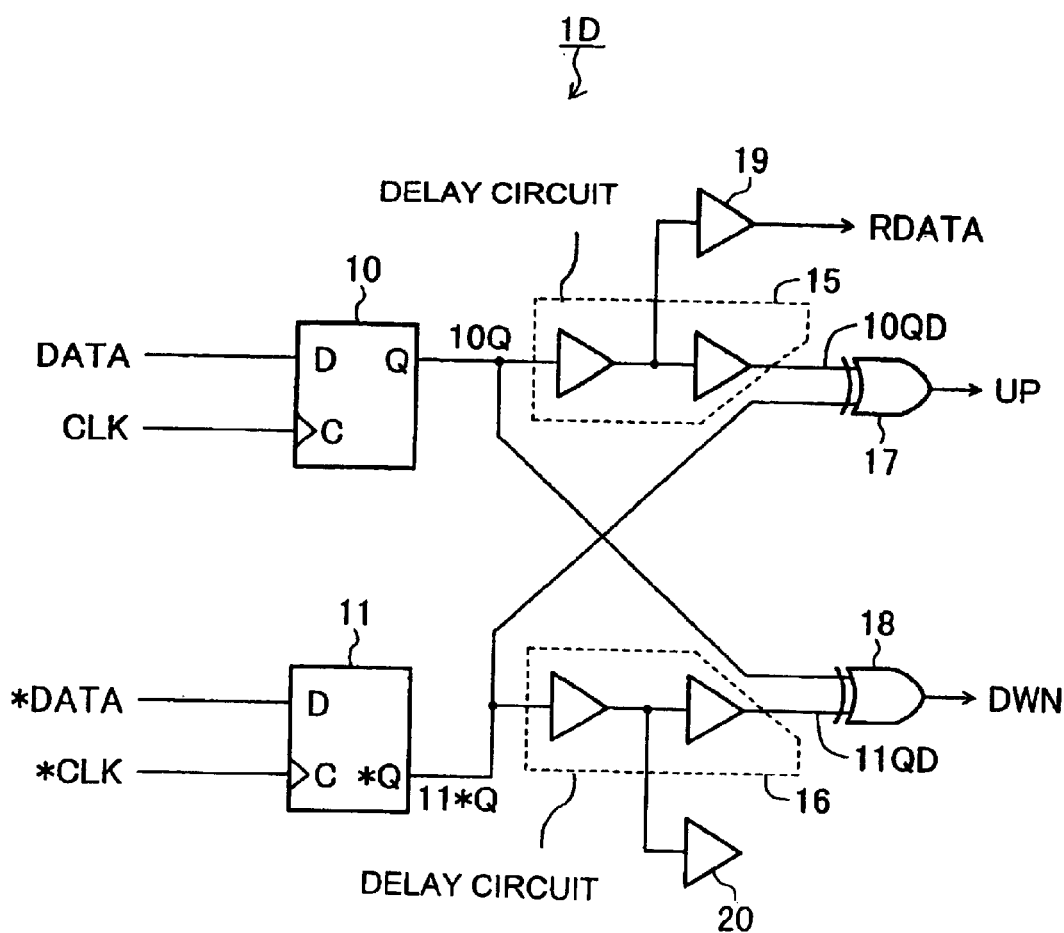
FIG. 11 is a diagram showing a phase comparator circuit of a fifth embodiment according to the present invention.

FIG. 11 shows a phase comparator circuit 1D of a fifth embodiment according to the present invention.

This circuit 1D is different from the circuit of FIG. 1 in that data signal *DATA which is in opposite phase to the data signal DATA is provided to the data input D of the D flip-flop 11, and the signal 11*Q of the inverting output of the D flip-flop 11 is provided to the XOR gate 17 and the delay circuit 16.

Note that the present invention includes circuits obtained by modifying the circuits of FIGS. 6, 7 and 10 in a similar manner as the above described.

Although preferred embodiments of the present invention has been described, it is to be understood that the invention is not limited thereto and that various changes and modifications may be made without departing from the spirit and scope of the invention.

What is claimed is:

1. A phase comparator circuit comprising:
   first and second flip-flop circuits for alternately capturing a data signal every half-cycle time of a first clock signal;
   first and second delay circuits for delaying outputs of said first and second flip-flop circuits to generate first and second delayed signals, respectively;
   a first logic gate circuit having an output activated when said output of said second flip-flop circuit and said first delayed signal are different logic levels; and
   a second logic gate circuit having an output activated when said output of said first flip-flop circuit and said second delayed signal are different logic levels;
   wherein a pulse width of said output of said first logic gate circuit is wider or narrower than that of said second logic gate circuit according to a case where said first clock signal lags or leads, respectively, an edge of said data signal in phase.

2. The phase comparator circuit of claim 1, wherein a delay time of said first delay circuit is substantially equal to that of said second delay circuit and shorter than a half cycle time of said first clock signal.

3. The phase comparator circuit of claim 1, wherein each of said first and second delay circuits has selectively variable delay times selected by a selection control signal.

4. The phase comparator circuit of claim 1, further comprising:
   third and fourth flip-flop circuits for alternately capturing said outputs of said first logic gate circuit and said second logic gate circuit, respectively, every half cycle time of a second clock signal which is different from said first clock signal in phase;
   wherein pulses are outputted from one of said outputs of said third and fourth flip-flop circuits according to a case where said first clock signal lags or leads an edge of said data signal in phase.

5. The phase comparator circuit of claim 4, further comprising:
   a third delay circuit for delaying said first clock signal to generate said second clock signal.

6. The phase comparator circuit of claim 5, wherein said third delay circuit has such a delay time that said third flip-flop circuit captures said output of said first logic gate circuit at a time point substantially in the middle of a pulse of said output of said first logic gate circuit when a pulse width of said output of said first logic gate circuit is larger than that of said second logic gate circuit.

7. A PLL circuit comprising:
   a phase comparator circuit including:
      first and second flip-flop circuits for alternately capturing a data signal every half-cycle time of a clock signal;
      first and second delay circuits for delaying outputs of said first and second flip-flop circuits to generate first and second delayed signals, respectively;
      a first logic gate circuit having an output activated when said output of said second flip-flop circuit and said first delayed signal are different logic levels; and
      a second logic gate circuit having an output activated when said output of said first flip-flop circuit and said second delayed signal are different logic levels;
      wherein a pulse width of said output of said first logic gate circuit is wider or narrower than that of said second logic gate circuit according to a case where said clock signal lags or leads, respectively, an edge of said data signal in phase;
   a loop filter circuit receiving an output of said phase comparator circuit; and
   a voltage controlled oscillator circuit receiving an output of said loop filter to provide said clock signal to said phase comparator circuit.

* * * * *